United States Patent [19]
Toedtman et al.

[11] Patent Number: 5,598,320
[45] Date of Patent: Jan. 28, 1997

[54] ROTABLE AND SLIDEBLE HEAT PIPE APPARATUS FOR REDUCING HEAT BUILD UP IN ELECTRONIC DEVICES

[75] Inventors: Thomas Toedtman; Randall S. Welch, both of Lake Forest, Calif.

[73] Assignee: AST Research, Inc., Irvine, Calif.

[21] Appl. No.: 399,409

[22] Filed: Mar. 6, 1995

[51] Int. Cl.⁶ .................................................. H05K 7/20
[52] U.S. Cl. ...................... 361/687; 361/700; 165/104.33
[58] Field of Search .................................... 361/680–687, 361/699, 700; 174/15.2; 165/104.17, 104.26, 104.33

[56] References Cited

PUBLICATIONS

Heat Pipe Design Guide for Notebook Computers—Wendy Lul, Jan. 1995, Intel.
Products Data Guide from Thermacore, Inc.—Miniature Heat Pipes For Notebook Computers—No date.
Products Data Guide from Thermacore, Inc.—Pentium Processor Thermal Management System—No date.
Thermacore Inc. Product Data Guide, Part #HP–N–B–TCP(610/75).

*Primary Examiner*—Leo P. Picard
*Assistant Examiner*—Jayprakash N. Gandhi
*Attorney, Agent, or Firm*—Lyon & Lyon

[57] ABSTRACT

A rotatable and slidable heat pipe apparatus for transferring heat away from a microprocessor chip more rapidly than by heat sink surface area dissipation to the surrounding air alone, comprising a heat sink with an integral cylindrical passageway adapted to receive a first end of a heat pipe shaped like a crankshaft, and a heat spreader formed from a metal plate with a first end rolled up to define a cylindrical opening adapted to receive a second end of the heat pipe. The heat spreader is attached to an underside of a keyboard. Since the heat pipe is able to rotate within the cylindrical passageway and the cylindrical opening, the keyboard can be raised to an open position and lowered to a closed position quickly and simply without the risk of breaking or bending the heat pipe, and manufacturing position tolerances between the heat pipe apparatus components are increased resulting in a simplified manufacturing process. The heat pipe can also be slid in to and out of the cylindrical passageway or the cylindrical opening, thereby enabling computer manufacturers to incorporate the heat pipe into portable battery powered notebook-type computer systems designed to allow a user to remove, replace, or swap internal components by simply flipping open or removing the keyboard, and further enabling a user to perform maintenance work or repairs on the computer system without concern for damage to the heat pipe.

24 Claims, 4 Drawing Sheets

5,598,320

ROTABLE AND SLIDEBLE HEAT PIPE APPARATUS FOR REDUCING HEAT BUILD UP IN ELECTRONIC DEVICES

FIELD OF THE INVENTION

This invention relates to a movable heat pipe apparatus for reducing heat build up in electronic devices, and more specifically to a rotatable and slidable heat pipe apparatus for reducing heat build up in a microprocessor chip.

BACKGROUND OF THE INVENTION

It is commonly known in the computer industry that the current generation of P5 type microprocessor chips, such as Intel Corporation's Pentium Processor, generate a significant amount of heat during operation. If the heat generated by the processor is not properly dissipated, then the heat builds up and raises the temperature of the microprocessor chip beyond its maximum recommended operating temperature, thereby adversely affecting the performance of the processor. The build up of heat will continue to be a problem in newer generations of microprocessor chips since, as the number of transistors being incorporated into each new processor design continues to increase, the amount of heat generated by the operation of these newer chips will also tend to increase.

Since an excessive amount of heat build up adversely affects the performance of the microprocessor chip, manufacturers and designers in the computer industry have responded to this heat build up problem by implementing various devices. These devices typically keep the microprocessor chip and nearby circuitry below the maximum recommended operating temperature by transferring or dissipating the heat generated by the microprocessor chip away from the chip and nearby circuitry.

For example, an electric fan is one of the earlier devices used to maintain the recommended operating temperature of the microprocessor chip. The electric fan is either placed on top of the processor to blow hot air away from the chip, or placed near the processor to blow cool air over the chip. However, there are some drawbacks to using the electric fan. First, the necessity for moving parts in these electric fans makes them unreliable. Second, the electric fans generate a significant amount of noise. Third, the use of electric fans in portable battery powered computers, where maximum battery life is desirable, is a drawback since providing power to the electric fan reduces the battery life of the computer. Fourth, the relatively large size of a typical electric fan requires a large amount of space inside the portable computer, where space is at a premium. Fifth, circulation of air into the electric fan also pulls in dust and debris.

Another device that is used to maintain the recommended operating temperature of the processor is a heat sink. Basically, the heat sink is placed in thermal communication with the processor, and comprises a thermally conductive block of metal used to transfer heat away from the processor and into the heat sink. The transferred heat is then dissipated through the surface area of the heat sink, thereby reducing the amount of heat build up in the processor. A typical heat sink comprises a plurality of protrusions, called fins, that increase the overall surface area of the heat sink, thereby providing for a more rapid and efficient dissipation of the heat transferred from the processor.

However, there are some drawbacks to using one primary heat sink, especially in portable computers that implement processors which generate a significant amount of heat, such as the Pentium Processor. First, if a significant amount of heat is generated by the processor, then a larger sized heat sink is necessary to adequately dissipate away the amount of heat that is generated. Second, larger sized heat sinks tend to weigh more, and take up more space. Therefore, since portable computer manufacturers are constantly striving to make their portable computers smaller and lighter, the use of the heat sink in a Pentium, or similar processor, based notebook-type computer is limited.

Another device used to maintain the recommended operating temperature of the microprocessor chip combines the use of a heat sink with an electric fan. One of the benefits of this combination is that a smaller heat sink can be used. Since the electric fan increases the dissipation of heat from the surface of the heat sink, a smaller heat sink with a fan can dissipate as much heat as a larger heat sink without a fan. However, the heat sink and electric fan combination remains hindered by all of the drawbacks relating to the use of the electric fan mentioned above for portable computer systems.

Recently, computer manufacturers have started using heat pipes to more efficiently, and more rapidly, transfer heat away from the processor via the heat sink. The heat pipe is used to transfer the heat away from the processor via the heat sink to an underside of a keyboard on the portable computer system for further dissipation. A typical heat pipe comprises a hollow copper tube partially filled with a fluid, such as water. In alternative embodiments, the heat pipe may be comprised of a solid heat conducting material, or be filled with various other fluids. By using the heat pipe, which transfers heat away from a microprocessor chip more rapidly than by heat sink surface area dissipation to the surrounding air alone, computer manufacturers are able to reduce the overall size of the heat sink while still providing for the same amount of heat dissipation. Therefore, it is desirable to use the heat pipe and smaller heat sink in a portable computer system, since the smaller heat sink does not add significantly to the size or weight of the portable computer system. The smaller heat sink, which would necessarily be larger without the use of the heat pipe, is placed in thermal communication with the processor, with a first end of the heat pipe affixed to the heat sink. A second end of the heat pipe is affixed to a metal panel located on the underside of the keyboard. Since the heat pipe is in a fixed position relative to the heat sink and keyboard, position tolerances are very small and extra care must be taken to ensure that these components are positioned properly in the computer system.

The use of the heat pipe in conjunction with the heat sink and keyboard reduces or eliminates many of the drawbacks associated with the fan and heat sink devices. For example, since no electric power is needed to run the heat pipe, there is no reduction in the battery life of the portable computer system. Furthermore, there is no dust or debris pulled in, no fan noise, and fan reliability problems. In addition, the heat sink can be made smaller and lighter since the heat pipe increases the ability of the smaller heat sink to transfer heat away from the processor.

However, there are some drawbacks with the way that the heat pipe is currently being used. For example, in most portable computer systems today, the processor is mounted to a printed circuit board with the heat sink attached to the processor, and the printed circuit board is typically attached to a bottom portion of a casing for the portable computer system. The keyboard is then typically attached as a lid to the casing, enclosing the printed circuit board that comprises the processor and the heat sink. Since the heat pipe is rigidly attached to the heat sink and to the underside of the keyboard during installation of the heat pipe, any attempt to remove the keyboard or to open up the portable computer system casing for maintenance, repairs, or modifications could result in a broken or bent heat pipe. In order to safely remove the keyboard or open up the casing, a user has to detach the rigidly affixed heat pipe from either the heat sink or the keyboard without breaking or bending the heat pipe.

In certain portable computer designs, the keyboard is designed to flip up or be removed so that various internal components, such as a battery, hard disk drive, or floppy disk drive can be removed, replaced, or swapped. Because of the rigid attachment of the heat pipe to the heat sink and keyboard in current heat pipe installations, a portable computer system implementing a flippable or removable keyboard design cannot take advantage of the heat dissipating benefits provided by the heat pipe, since the keyboard cannot be removed without the likelihood of damaging the heat pipe.

Therefore, a better solution is needed to provide the heat dissipating benefits of the heat pipe without the drawbacks associated with current heat pipe implementations.

SUMMARY OF THE INVENTION

A movable heat pipe apparatus of the present invention for reducing heat build up in electronic devices provides heat dissipating benefits in a portable computer system without the drawbacks associated with prior art heat pipe implementations. The movable heat pipe apparatus comprises the heat pipe, a heat sink, and a heat spreader. In a preferred embodiment, the movable heat pipe apparatus is used for reducing heat build up in electronic devices in portable battery powered computer systems that implement processors which generate a significant amount of heat.

For example, Intel Corporation has recently introduced Pentium Processor chips that are delivered to computer manufacturers on a tape carrier package (TCP). These TCP Pentium Processors are primarily for use in portable battery powered notebook-type computer systems because of their reduced size and weight. These TCP Pentium Processors are not packaged in protective ceramic casings, but they do generate a significant amount of heat. Therefore, in a preferred embodiment, the movable heat pipe apparatus of the present invention may be used to reduce heat build up in a TCP Pentium Processor used in a portable battery powered notebook-type computer system.

The movable heat pipe apparatus of the present invention is designed with the heat sink comprising an integral cylindrical passageway adapted to receive a first end of the heat pipe. The heat spreader comprises a metal plate with a first end rolled up to define a cylindrical opening adapted to receive a second end of the heat pipe. The heat pipe is preferably bent in two places, and shaped similar to a lightning bolt or crankshaft such that the first end and second end are approximately parallel to each other, and a middle portion of the heat pipe is offset at an angle from a centerline, wherein the centerline defines an imaginary line that runs between and approximately parallel to the imaginary parallel lines defined by the first end and second end of the heat pipe.

The processor is typically located on a printed circuit board, with the printed circuit board being attached to a bottom portion of a casing of the portable computer system. The heat sink is positioned in thermal communication with the processor and can be secured to the processor with an adhesive, or secured to the printed circuit board via an attachment device such as a clip with screws. The first end of the heat pipe is slid into the cylindrical passageway integral to the heat sink, wherein the first end is rotatable within the cylindrical passageway. The heat pipe is rotated like a crankshaft such that the second end of the heat pipe is positioned above the level of the first end thereby enabling the cylindrical opening of the heat spreader to be slid onto the second end of the heat pipe, wherein the second end is rotatable within the cylindrical opening.

In a preferred embodiment, the heat spreader is attached to a metal panel on the underside of the keyboard. The keyboard is moved to its closed position by rotating the heat pipe in conjunction with the downward movement of the keyboard such that the second end of the heat pipe is lowered toward the level of the first end. The heat sink and heat spreader retain their orientation relative to a horizontal plane since the heat pipe rotates within the cylindrical passageway and the cylindrical opening. Removal of the keyboard is accomplished by reversing these steps.

Since, in a preferred embodiment, the heat spreader is attached to the metal panel underneath the keyboard, the thickness of the metal plate of the heat spreader in conjunction with the larger surface area of the metal panel assists in the rapid dissipation of heat being transferred from the heat sink through the heat pipe and to the metal plate of the heat spreader and the metal panel of the keyboard.

In another preferred embodiment, the second end of the heat pipe is designed to maintain movable thermal contact with a heat dissipating surface, such as the metal panel underneath the keyboard, without actually being attached to the heat dissipating surface.

By designing the heat pipe to be rotatable and slidable within the cylindrical passageway and cylindrical opening, and by designing the neat pipe with a pair of bends so as to be shaped similar to a crankshaft, the keyboard can be detached and removed quickly, simply, and without the risk of breaking or bending the heat pipe. In addition, by designing the heat pipe to rotate and slide with respect to the heat sink and heat spreader, position tolerances between these components are increased. Therefore, unlike the rigidly fixed heat pipe implementation of the prior art which requires precise placement of the components in the computer system, the movable heat pipe apparatus of the present invention simplifies the manufacturing process by allowing the movable heat pipe apparatus components to be positioned in the computer system with less precision. This is due to increased tolerances resulting from the movable coupling between the heat pipe and heat sink, as well as between the heat pipe and the heat spreader.

Furthermore, this improved configuration can be used in conjunction with portable computer systems designed to allow a user to remove, replace, or swap internal components by simply flipping open and removing the keyboard. The keyboard may be detached by moving the keyboard upward into its open position, with the heat pipe rotating within the cylindrical passageway and cylindrical opening in conjunction with the upward movement of the keyboard away from the casing, and then sliding the first end of the heat pipe out of the heat sink's cylindrical passageway or sliding the keyboard's cylindrical opening off of the second end of the heat pipe.

It is known in the art that the use of a thermal grease between two metallic contact points improves thermal transfer. Since the heat pipe, cylindrical passageway, and cylindrical opening do not have perfectly smooth surfaces, air gaps exist in the contact region between the heat pipe and the heat sink, as well as between the heat pipe and the heat spreader. The use of the thermal grease, which is more conductive than air, fills in these air gaps and provides a more continuous contact region between the heat pipe and the heat sink, as well as between the heat pipe and the heat spreader. In a preferred embodiment, thermal grease is not used if the heat pipe apparatus dissipates enough heat for the proper operation of the processor, since the application of thermal grease increases manufacturing costs. However, if maximal heat dissipation is required for proper operation, it is to be understood that thermal grease may be used on the first and second ends of the heat pipe to improve thermal transfer in the contact region between the heat pipe and heat sink, as well as between the heat pipe and the heat spreader.

The above described implementation of the novel rotatable and slidable heat pipe apparatus provides benefits previously unavailable to computer systems implementing the heat pipe with rigid attachments to the heat sink and keyboard.

Accordingly, it is an object of the present invention to provide an improved heat pipe apparatus for reducing heat build up in electronic devices.

It is a further object of the present invention to provide a movable heat pipe apparatus for reducing heat build up in electronic devices.

Yet another object of the present invention is to provide a movable heat pipe apparatus for increasing position tolerances between the heat pipe apparatus components.

A further object of the present invention is to provide a movable heat pipe apparatus for increasing position tolerances between the heat pipe apparatus components, while maintaining the thermal connections between the components.

An additional object of the present invention is to provide a rotatable and slidable heat pipe apparatus for reducing heat build up in microprocessor chips.

Another object of the present invention is to provide a rotatable and slidable heat pipe apparatus for dissipating heat from a microprocessor chip, while allowing a keyboard to be easily removed from a portable computer system with minimal risk of damage to the heat pipe.

Further objects and advantages of the present invention will become apparent from a consideration of the drawings and ensuing description.

DETAILED DESCRIPTION OF A PREFERRED EMBODIMENT

Figure 1:
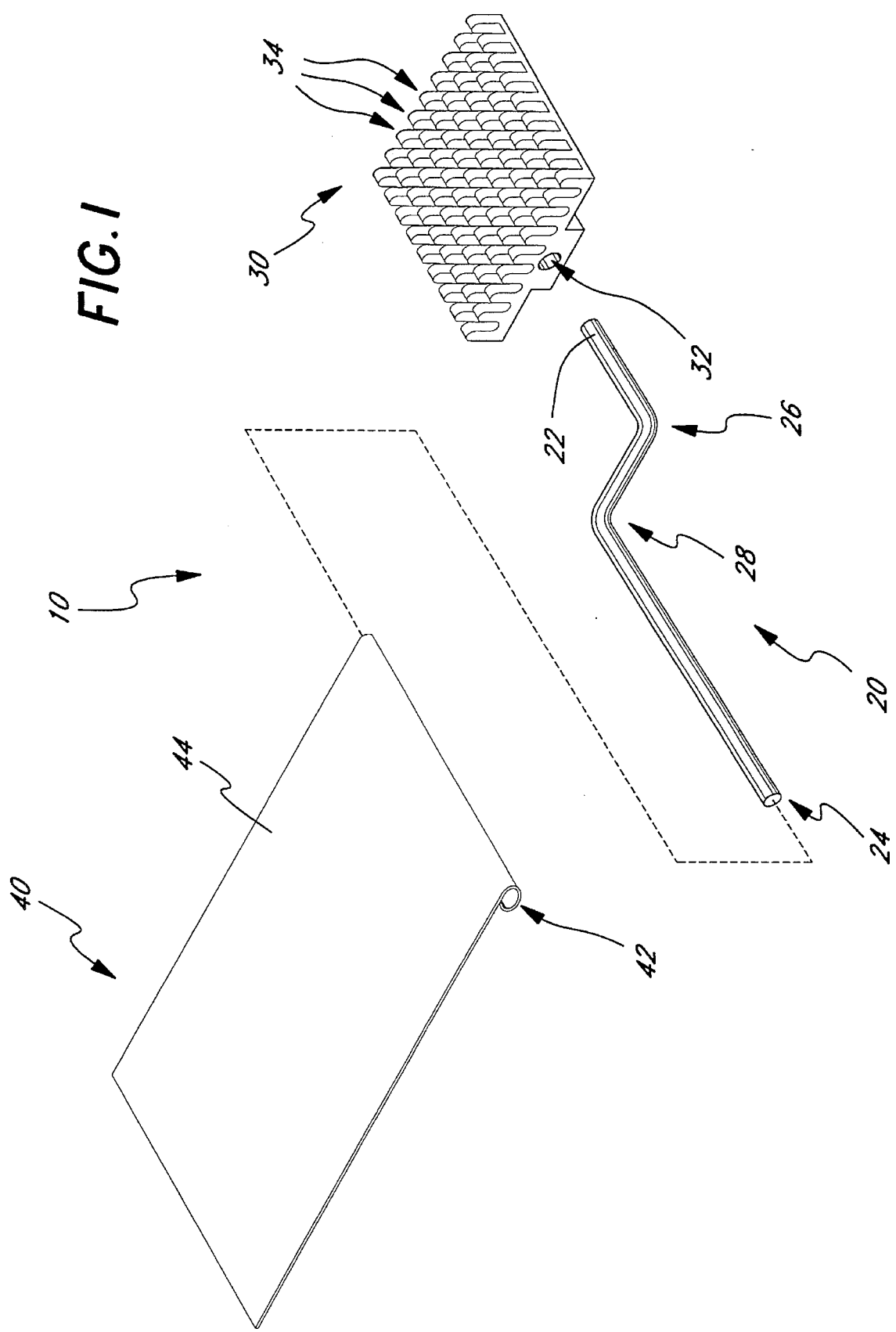
FIG. 1 is an exploded perspective view of a movable heat pipe apparatus comprising a heat pipe, a heat sink, and a heat spreader.

FIG. 1 illustrates a movable heat pipe apparatus 10 comprising a heat pipe 20, a heat sink 30, and a heat spreader 40. The heat pipe 20 comprises a first end 22 and a second end 24. The heat pipe 20 has a first bend 26 and a second bend 28 such that the shape of the heat pipe 20 resembles a crankshaft.

The heat sink 30 comprises an integral cylindrical passageway 32 that is adapted to receive the first end 22 of the heat pipe 20, while still allowing the heat pipe 20 to rotate within the cylindrical passageway 32. The heat sink 30 further comprises a plurality of fins 34 designed to increase the surface area of the heat sink 30, thereby increasing the surface area from which heat can dissipate. In a preferred embodiment, the heat sink 30 is attached to a processor (not shown) via a thermal interface.

The heat spreader 40 comprises a metal plate 44 with one end of the metal plate 44 rolled up to define a cylindrical opening 42 adapted to receive the second end 24 of the heat pipe 20, while still allowing the heat pipe 20 to rotate within the cylindrical opening 42.

Since the heat pipe rotates and slides with respect to the heat sink and heat spreader, position tolerances between these components are increased, thereby simplifying the manufacturing process by allowing the movable heat pipe apparatus components to be positioned in the computer system with less precision due to increased tolerances resulting from the movable coupling between the heat pipe and heat sink, as well as between the heat pipe and the heat spreader.

It is to be understood that while the function of the heat spreader 40 is essential, the actual use of the heat spreader 40 with the cylindrical opening 42 is not. All that is required is that the heat pipe 20 be in movable thermal communication with a heat dissipating surface, as further discussed below.

Figure 2:
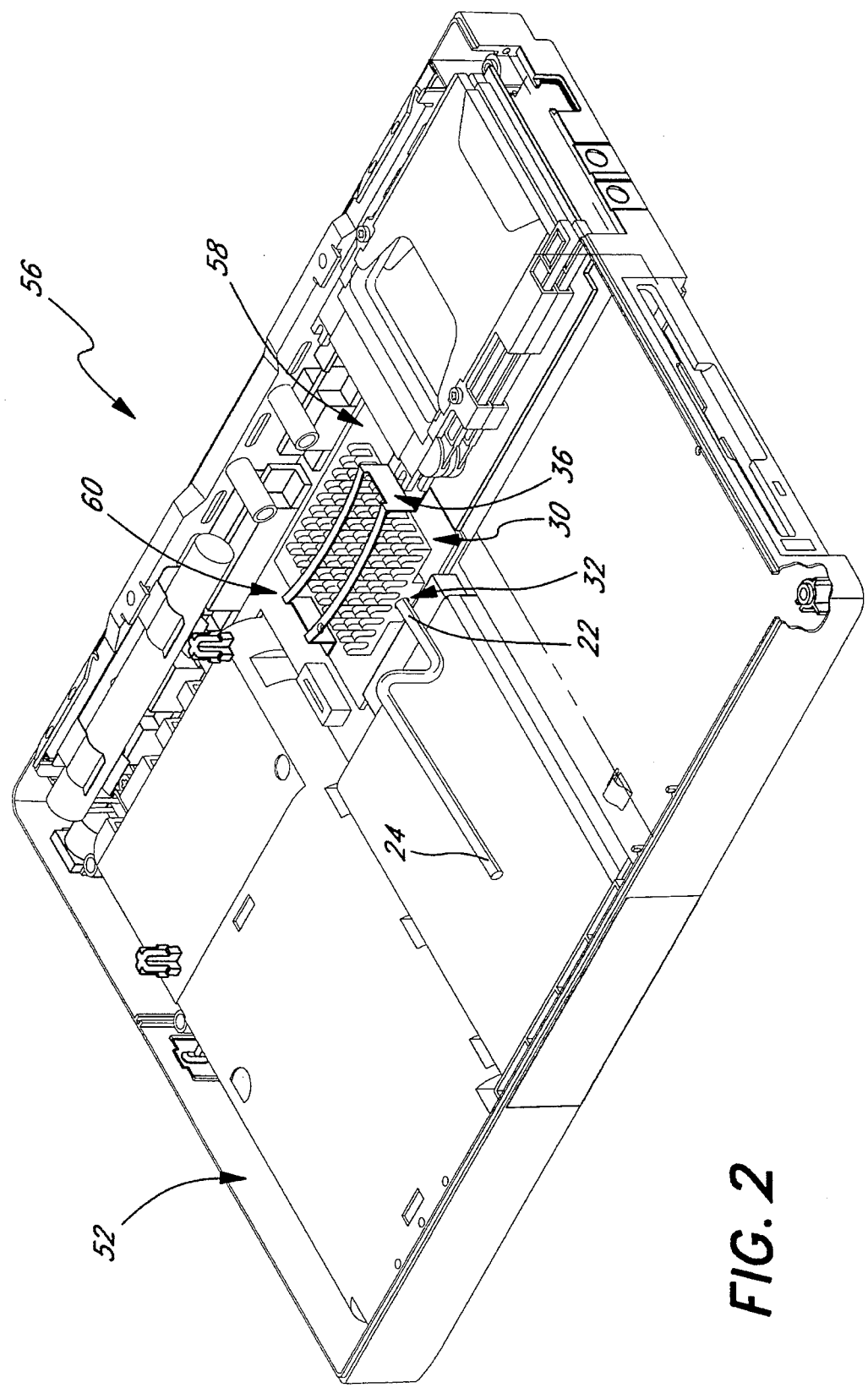
FIG. 2 is a partial perspective view of a portable battery powered notebook-type computer system shown highlighting the insertion of a first end of the heat pipe into the heat sink's cylindrical passageway, and with the heat pipe rotated like a crankshaft to a raised position such that the second end of the heat pipe is positioned above the first end.
Figure 3:
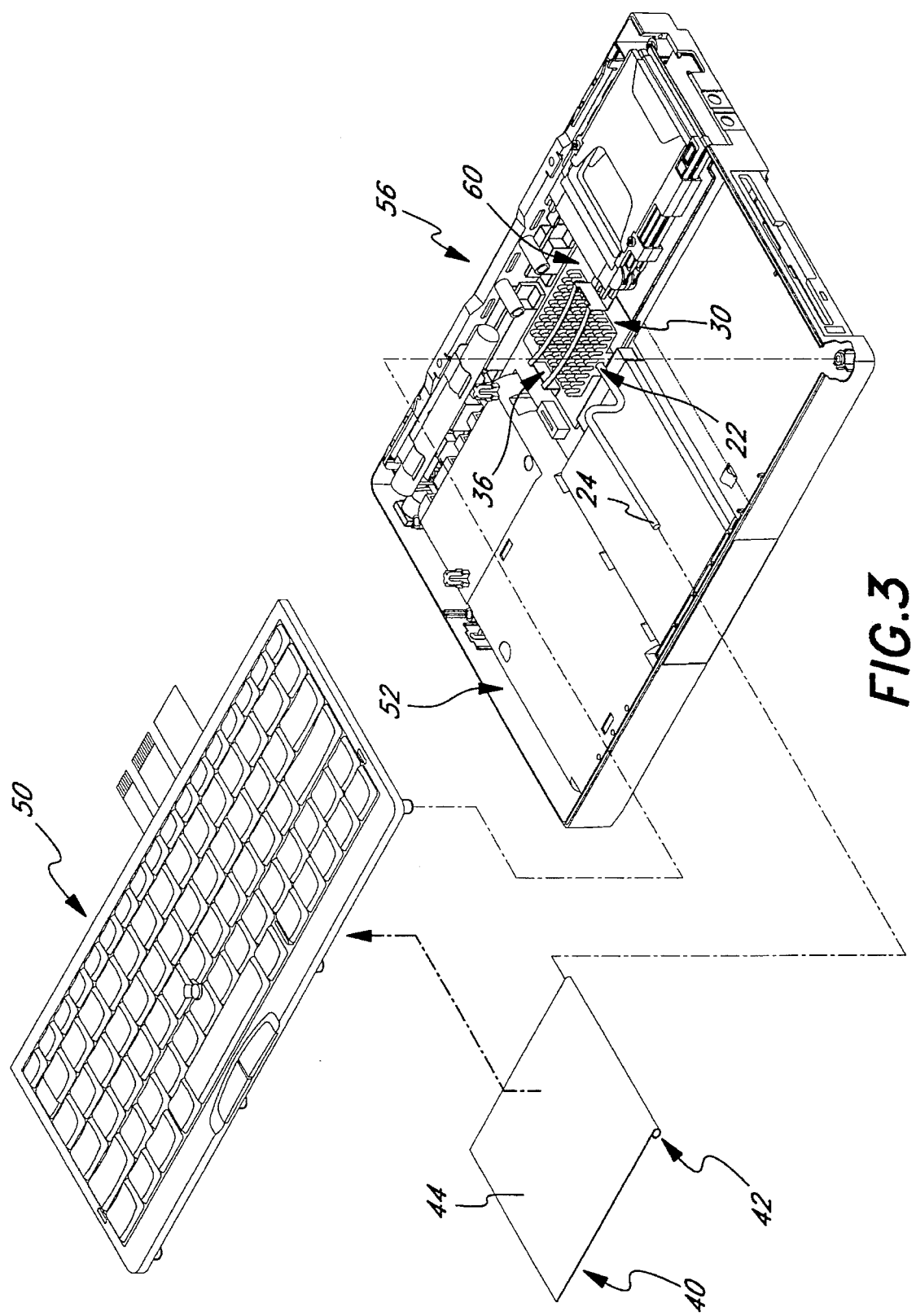
FIG. 3 is an exploded partial perspective view of the portable battery powered notebook-type computer system shown highlighting a heat spreader for attachment to a keyboard, and the heat spreader for attachment to the heat pipe by sliding a cylindrical opening of the heat spreader over the second end of the heat pipe.
Figure 4:
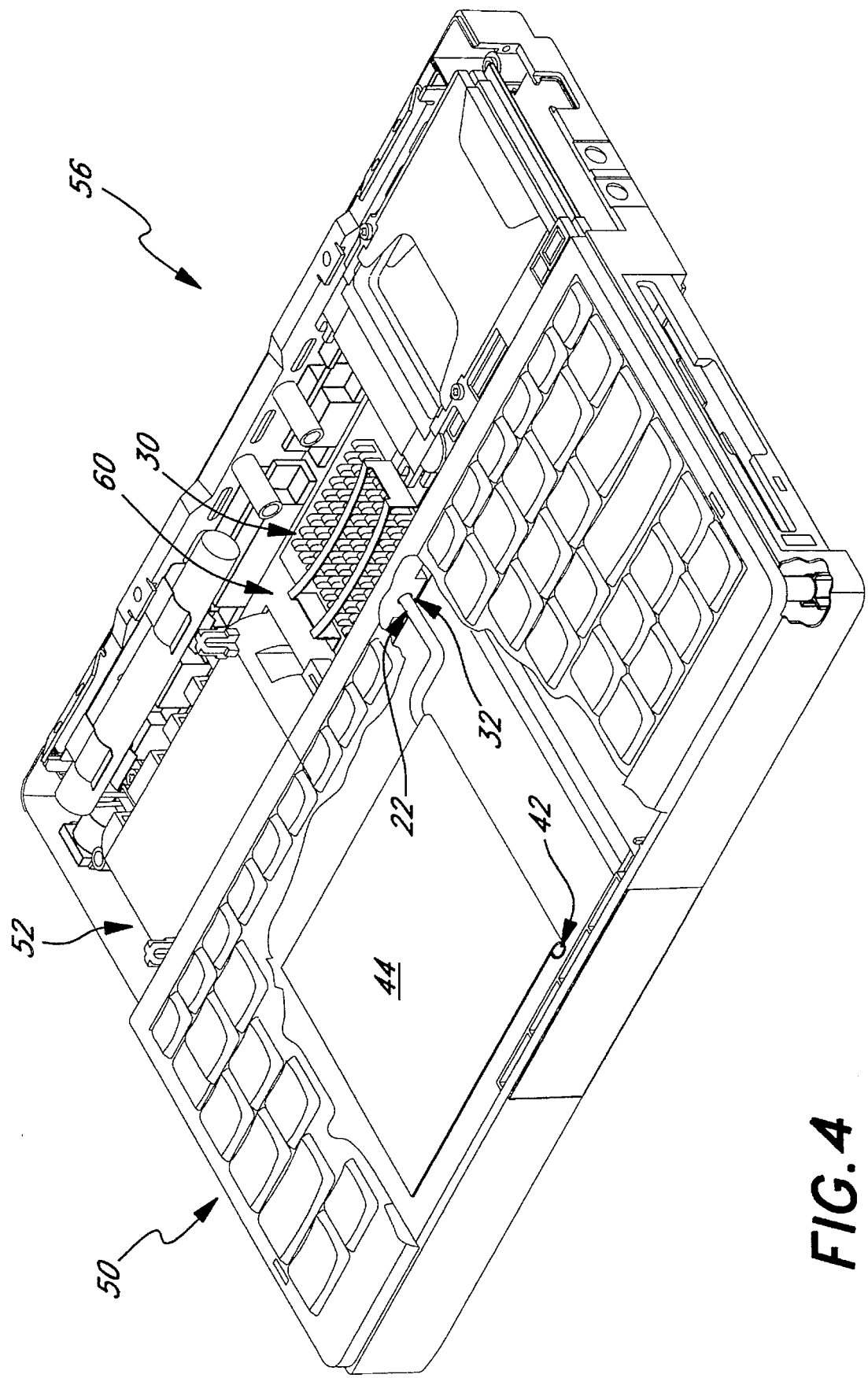
FIG. 4 is a partial perspective view of the portable battery powered notebook-type computer system shown partially in phantom highlighting the movable heat pipe apparatus with the keyboard rotated to its closed position by rotating the heat pipe within the cylindrical passageway and cylindrical opening in conjunction with the movement of the keyboard such that the second end of the heat pipe is lowered toward the level of the first end in a counterclockwise direction. The heat sink and keyboard retain their orientation relative to a horizontal plane since the heat pipe rotates within the cylindrical passageway of the heat sink and the cylindrical opening of the heat spreader attached to the keyboard.

FIGS. 2–4 illustrate the steps necessary for attaching a keyboard 50 to a computer system casing 52 in a portable battery powered notebook-type computer system 56 (shown without a display) implementing the movable heat pipe apparatus 10 of the present invention. The keyboard 50 typically has a metal panel (not shown) attached to an underside of the keyboard 50. The keyboard 50 can be removed or detached from the computer system casing 52 by reversing the steps shown in FIGS. 2–4 and described below, thereby enabling a user to remove, replace, or swap internal components such as a battery, hard disk drive, or floppy disk drive (components not labeled for clarity) without risk of damage to the heat pipe 20.

FIG. 2 illustrates a minimal number of features necessary to convey the proper operation of the movable heat pipe 20 of the present invention. Various other details in a typical portable battery powered notebook-type computer system are well known in the art and are not shown or labeled since they are not relevant to the operation of the present invention. FIG. 2 shows the portable battery powered notebook-type computer system 56 (without a display) with the heat sink 30 attached to the processor (the processor is located underneath the heat sink 30, and is therefore not visible in this view). The processor is mounted to a printed circuit board 58 and the heat sink 30 is thermally coupled to the processor, with the printed circuit board 58 attached to a bottom portion 60 of the computer system casing 52. In another preferred embodiment, the heat sink 30 is mounted to the printed circuit board 58 using a clip 36. The first end of the heat pipe 22 is slid into the cylindrical passageway 32 which is integral to the heat sink 30. The heat pipe 20 is shown rotated to a raised position such that the second end 24 is positioned above the level of the first end 22.

Referring now to FIG. 3, the keyboard 50 is connected to the heat pipe 20 in the following way. In a preferred embodiment, the heat spreader 40 comprising the cylindrical opening 42 and metal plate 44 is attached to the metal panel (not shown) underneath the keyboard 50. It is to be understood that a cylindrical opening can be placed directly onto the underside of the keyboard 50 without the use of a rolled portion of the heat spreader 40 or the metal panel underneath the keyboard 50. The keyboard 50 and heat spreader 40 are then connected to the heat pipe 20 by sliding the cylindrical opening 42 of the heat spreader 40 or the second end 24 of the heat pipe 20 as shown in FIG. 3 by the dotted line between the cylindrical opening 42 and the second end 24 of the heat pipe 20.

Furthermore, the metal panel of the keyboard 50 can be designed to make contact with the second end 24 of the heat pipe 20 to further dissipate heat without actually receiving or encircling the second end 24 of the heat pipe 20. For example, the heat pipe 20 can be positioned such that the placement of the keyboard 50 onto the casing 52 causes the metal panel of the keyboard 50 to contact the heat pipe 20, without actually attaching the second end 24 of the heat pipe 20 to the keyboard 50. It is to be understood that any heat dissipating surface can be used in place of the metal panel of the keyboard 50 to further dissipate heat.

To move the keyboard 50 from a raised open position after being slid onto the raised heat pipe 20 to a lowered closed position as shown in FIG. 4, the keyboard 50 is moved downward into its closed position relative to the computer system casing 52. As the keyboard 50, metal panel, and heat spreader 40 are being moved downward, the heat pipe 20, in this illustration, rotates in a counterclockwise direction such that the second end 24 is lowered toward the level of the first end 22. The heat pipe 20 is rotated counterclockwise while the heat sink 30 and the keyboard 50 retain their orientation relative to a horizontal plane since the heat pipe 30 rotates within the cylindrical passageway 32 of the heat sink 30 and the cylindrical opening 42 of the heat spreader 40.

The keyboard 50 can be removed from the computer system casing 52 by reversing the steps shown in FIGS. 2–4 and described above, thereby enabling a user to remove, replace, or swap internal components such as a battery, hard disk drive, or floppy disk drive (components not labeled) without risk of damage to the heat pipe 20.

It should be noted that the particular shape of a heat pipe can be modified with any number of bends, or no bends, to accommodate the space requirements inside a particular portable computer system. However, the number of bends does have an effect on the performance of the heat pipe 20. A heat pipe can be kept straight if a keyboard with an attached cylindrical opening is designed to be removed by sliding the keyboard outward and away from the casing without the need to first raise the keyboard.

Furthermore, so long as a keyboard incorporates some type of attached cylindrical opening, a person of ordinary skill in the art can implement the concepts of the present invention without the use of a heat spreader.

Moreover, it is to be understood that in a desktop unit the heat spreader can be positioned someplace other than underneath a keyboard, since desktop computers have keyboards that are external to a computer system's housing unit which encloses the processor. For example, in a desktop unit, the heat spreader can be positioned against one of the interior walls of the computer system's housing unit for improved heat dissipation.

In addition, although the benefits of the present invention are best utilized in a portable battery powered notebook-type computer system based on a processor that generates a significant amount of heat, such as the Pentium Processor, the advantages of the present invention can be used in any processor based computer system. Furthermore, any chip (not just microprocessors) that generates a significant amount of heat and requires heat dissipation can benefit from the movable heat pipe apparatus of the present invention.

While the above descriptions contain many specificities, these should not be construed as limitations on the scope of the invention, but rather as exemplifications of preferred embodiments thereof. Many other variations are possible.

What is claimed is:

1. A portable battery powered notebook-type computer system comprising a movable heat pipe apparatus, said movable heat pipe apparatus comprising a heat sink capable of being placed in thermal communication with an electronic device, a heat pipe comprising a first end and a second end,
   said first end capable of being movably coupled to said heat sink, and
   said second end capable of being movably coupled to a heat dissipating surface, said heat sink comprises a plurality of fins for increased surface area and an integral cylindrical passageway adapted for receiving said first end of said heat pipe wherein said first end is capable of sliding and rotating within said cylindrical passageway, said heat dissipating surface is a heat spreader comprising a metal plate and a cylindrical opening formed from one end of said metal plate and adapted for receiving said second end of said heat pipe wherein said second end is capable of sliding and rotating within said cylindrical opening, said cylindrical opening being positioned on an underside of a keyboard, and said heat pipe is shaped such that said second end is approximately parallel to said first end and said second end is capable of being rotated about an axis defined by said first end.

2. The portable battery powered notebook-type computer system of claim 1 wherein said heat spreader is attached to a metal panel located on said underside of said keyboard.

3. The movable heat pipe apparatus of claim 1 wherein said heat pipe is movably coupled to said heat sink, and said heat pipe is movably coupled to said heat dissipating surface, thereby enabling three dimensional movement of said heat dissipating surface relative to said heat sink.

4. The computer system of claim 3, wherein said heat spreader is attached to a wall of said casing.

5. A heat pipe apparatus comprising a heat pipe having a first end, a second end, and at least one bend, wherein the at least one bend is between the first and second ends, a heat sink attachable to said first end in a rotatable and slidable fashion, a heat spreader attachable to said second end in a rotatable and slidable fashion, wherein the at least one bend, the slidable rotatable attachment between the first end and the heat sink, and the slidable rotatable attachment between the second end and the heat spreader enable movement of said heat spreader from a first position to a second position relative to said heat sink.

6. The heat pipe apparatus of claim 5 wherein the heat spreader and the heat sink are substantially in a single plane when the heat spreader is in the first position, and wherein the heat spreader and the heat sink are substantially in two planes when the heat spreader is in the second position.

7. The heat pipe apparatus of claim 5 wherein the heat spreader and the heat sink are substantially in a single plane when the heat spreader is in the first position, and wherein the heat spreader and the heat sink are substantially in two parallel planes when the heat spreader is in the second position.

8. A movable heat pipe apparatus comprising a heat sink capable of being placed in thermal communication with an electronic device, a heat pipe comprising a first end and a second end, said first end capable of being movably coupled to said heat sink, and said second end capable of being movably coupled to and placed in thermal communication with a heat dissipating surface, wherein said movable coupling between said first end and said heat sink, and between said second end and said heat dissipating surface, provides increased position tolerances between said heat pipe and said heat sink, and between said heat pipe and said heat dissipating surface.

9. A computer system comprising a casing enclosing a microprocessor chip, said computer casing comprising a movable heat pipe apparatus, said movable heat pipe apparatus comprising a heat pipe comprising a first end and a second end, said heat pipe being shaped wherein said second end is capable of being rotated about an axis defined by said first end, a heat sink capable of being placed in thermal communication with an electronic device, said heat sink comprising a plurality of fins and a cylindrical passageway adapted for receiving said first end of said heat pipe wherein said first end is capable of sliding and rotating within said cylindrical passageway, and a heat spreader comprising a metal plate and a cylindrical opening adapted for receiving said second end of said heat pipe wherein said second end is capable of sliding and rotating within said cylindrical opening.

10. A movable heat pipe apparatus comprising a heat pipe comprising a first end and a second end, a heat sink capable of being placed in thermal communication with an electronic device, a cylindrical opening defining a heat dissipating surface capable of being located on an underside of a keyboard, said heat sink comprising an integral cylindrical passageway adapted for receiving said first end of said heat pipe wherein said first end is capable of sliding and rotating within said cylindrical passageway, and said cylindrical opening being adapted for receiving said second end of said heat pipe wherein said second end is capable of sliding and rotating within said cylindrical opening.

11. The movable heat pipe apparatus of claim 10, wherein said heat pipe is shaped such that said second end is capable of being rotated at least partially about an axis defined by said first end.

12. The movable heat pipe apparatus of claim 10, wherein said electronic device is a microprocessor chip.

13. The movable heat pipe apparatus of claim 12, wherein said microprocessor chip is an Intel Corporation Pentium Processor.

14. The movable heat pipe apparatus of claim 10, wherein said electronic device is a non-processor chip.

15. The movable heat pipe apparatus of claim 10, wherein said cylindrical opening is attached to said underside of said keyboard.

16. The movable heat pipe apparatus of claim 10, wherein said cylindrical passageway coupling said first end and said heat sink, and said cylindrical opening coupling said second end and said heat dissipating surface, provide increased position tolerances between said heat pipe and said heat sink, and between said heat pipe and said heat dissipating surface.

17. A movable heat pipe apparatus comprising a heat pipe comprising a first and a second end, a heat sink capable of being placed in thermal communication with an electronic device, a heat spreader comprising a metal plate capable of being located on an underside of a keyboard, said heat pipe being shaped wherein said second end is capable of being rotated at least partially about an axis defined by said first end, said heat sink comprising an integral cylindrical passageway adapted for receiving said first end of said heat pipe wherein said first end is capable of sliding and rotating within said cylindrical passageway, and said heat spreader further comprising a cylindrical opening adapted for receiving said second end of said heat pipe wherein said second end is capable of sliding and rotating within said cylindrical opening.

18. The movable heat pipe apparatus of claim 17 wherein said heat spreader is attached to said underside of said keyboard.

19. The movable heat pipe apparatus of claim 17 wherein said heat sink further comprises a plurality of fins.

20. A portable battery powered notebook-type computer system comprising a movable heat pipe apparatus, said movable heat pipe apparatus comprising a heat sink capable of being placed in thermal communication with an electronic device, a heat pipe comprising a first end and a second end, said first end capable of being movably coupled to said heat sink, and said second end capable of being movably coupled to a heat dissipating surface wherein said second end is capable of being rotated at least partially about an axis defined by said first end.

21. The portable battery powered notebook-type computer system of claim 20, wherein said heat sink comprises a plurality of fins and a cylindrical passageway adapted for receiving said first end of said heat pipe wherein said first end is capable of sliding and rotating within said cylindrical passageway, said heat dissipating surface comprises a metal plate and a cylindrical opening adapted for receiving said second end of said heat pipe wherein said second end is capable of sliding and rotating within said cylindrical opening, said heat dissipating surface being positionable on an underside of a keyboard.

22. The portable battery powered notebook-type computer system of claim 21 wherein said heat dissipating surface is attached to said underside of said keyboard.

23. A computer system comprising a casing enclosing a microprocessor chip, said computer casing comprising a movable heat pipe apparatus, said movable heat pipe apparatus comprising a heat pipe comprising a first end and a second end, a heat sink comprising a plurality of fins capable of being placed in thermal communication with an electronic device, a heat spreader comprising a metal plate, said heat pipe being shaped wherein said second end is approximately parallel to said first end and said second end is capable of being rotated about an axis defined by said first end, said heat sink further comprising an integral cylindrical passageway adapted for receiving said first end of said heat pipe wherein said first end is capable of sliding and rotating within said cylindrical passageway, and said heat spreader further comprising a cylindrical opening formed from one end of said metal plate and adapted for receiving said second end of said heat pipe wherein said second end is capable of sliding and rotating within said cylindrical opening.

24. The computer system of claim 23, wherein said heat spreader is attached to an interior wall of said casing.

* * * * *